United States Patent
Huang et al.

(10) Patent No.: US 9,613,722 B2
(45) Date of Patent: Apr. 4, 2017

(54) METHOD AND APPARATUS FOR REVERSE MEMORY SPARING

(71) Applicant: Intel Corporation, Santa Clara, CA (US)

(72) Inventors: George H. Huang, Santa Clara, CA (US); Debaleena Das, Los Gatos, CA (US); Brian S. Morris, Santa Clara, CA (US); Rajat Agarwal, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 183 days.

(21) Appl. No.: 14/497,834

(22) Filed: Sep. 26, 2014

(65) Prior Publication Data
US 2016/0093404 A1 Mar. 31, 2016

(51) Int. Cl.
*G06F 11/00* (2006.01)
*G11C 29/00* (2006.01)
*G06F 11/07* (2006.01)

(52) U.S. Cl.
CPC ......... *G11C 29/883* (2013.01); *G06F 11/073* (2013.01); *G06F 11/0751* (2013.01); *G06F 11/0793* (2013.01)

(58) Field of Classification Search
CPC .. G11C 29/883; G06F 11/073; G06F 11/0751; G06F 11/0793; G06F 11/2094
See application file for complete search history.

(56) References Cited

U.S. PATENT DOCUMENTS

| | | | | |
|---|---|---|---|---|
| 5,566,316 A | * | 10/1996 | Fechner | G06F 11/1662 711/114 |
| 2003/0225970 A1 | * | 12/2003 | Hashemi | G06F 11/1076 711/114 |
| 2007/0239944 A1 | | 10/2007 | Rupanagunta et al. | |
| 2011/0179311 A1 | | 7/2011 | Nachimuthu et al. | |
| 2013/0332799 A1 | | 12/2013 | Cho et al. | |
| 2013/0339821 A1 | | 12/2013 | Cordero et al. | |
| 2014/0082411 A1 | | 3/2014 | Warnes | |
| 2016/0093404 A1 | * | 3/2016 | Huang | G06F 11/073 714/6.13 |

OTHER PUBLICATIONS

Notification of Transmittal of the International Search Report and the Written Opinion of the International Searching Authority from counterpart Patent Cooperation Treaty Application No. PCT/US2015/049351 mailed Dec. 14, 2015, 9 pages.

* cited by examiner

*Primary Examiner* — Philip Guyton
(74) *Attorney, Agent, or Firm* — Nicholson De Vos Webster & Elliott LLP

(57) ABSTRACT

An apparatus and method are described for performing forward and reverse memory sparing operations. For example, one embodiment of a processor comprises memory sparing logic to perform a first forward memory sparing operation at a first level of granularity in response to detecting a memory failure; the memory sparing logic to perform a reverse memory sparing operation in response to a determination of an improved sparing state having a second level of granularity; and the memory sparing logic to responsively perform a second forward memory sparing operation at the second level of granularity.

24 Claims, 19 Drawing Sheets

US 9,613,722 B2

METHOD AND APPARATUS FOR REVERSE MEMORY SPARING

BACKGROUND

Field of the Invention

This invention relates generally to the field of computer processors. More particularly, the invention relates to a method and apparatus for reverse memory sparing.

Description of the Related Art

Dynamic Random Access Memory (DRAM) is organized into rows and columns, and is accessed by electrical signals called "strobes" which are transmitted along the rows to the columns. To access memory, the memory controller activates the Row Access Strobe line to indicate the row where data is to be found (high bits) and the Column Access Strobe specifies the column (low bits). The data is then provided to the output line and to its destination on the next clock cycle.

DRAM devices have a high failure rate. Current memory architectures solutions use "Sparing" techniques to reduce the annual service rate (ASR) of the memory subsystem by physically mapping out failed regions. Memory starts in a non-failed state. Hardware and/or firmware identify a hard DRAM failure and invoke a sparing resource to map out the failure, moving the memory to the n failure state. Subsequent hard failures may invoke additional sparing, if available, which moves memory to the n+1 failure state. This is referred to as "Forward Sparing" in this description, or more generally in the industry as simply "Sparing." After all forward sparing resources are used, a service call must be initiated.

BRIEF DESCRIPTION OF THE DRAWINGS

A better understanding of the present invention can be obtained from the following detailed description in conjunction with the following drawings, in which.

DETAILED DESCRIPTION

In the following description, for the purposes of explanation, numerous specific details are set forth in order to provide a thorough understanding of the embodiments of the invention described below. It will be apparent, however, to one skilled in the art that the embodiments of the invention may be practiced without some of these specific details. In other instances, well-known structures and devices are shown in block diagram form to avoid obscuring the underlying principles of the embodiments of the invention.

Exemplary Processor Architectures and Data Types

Figure 1:
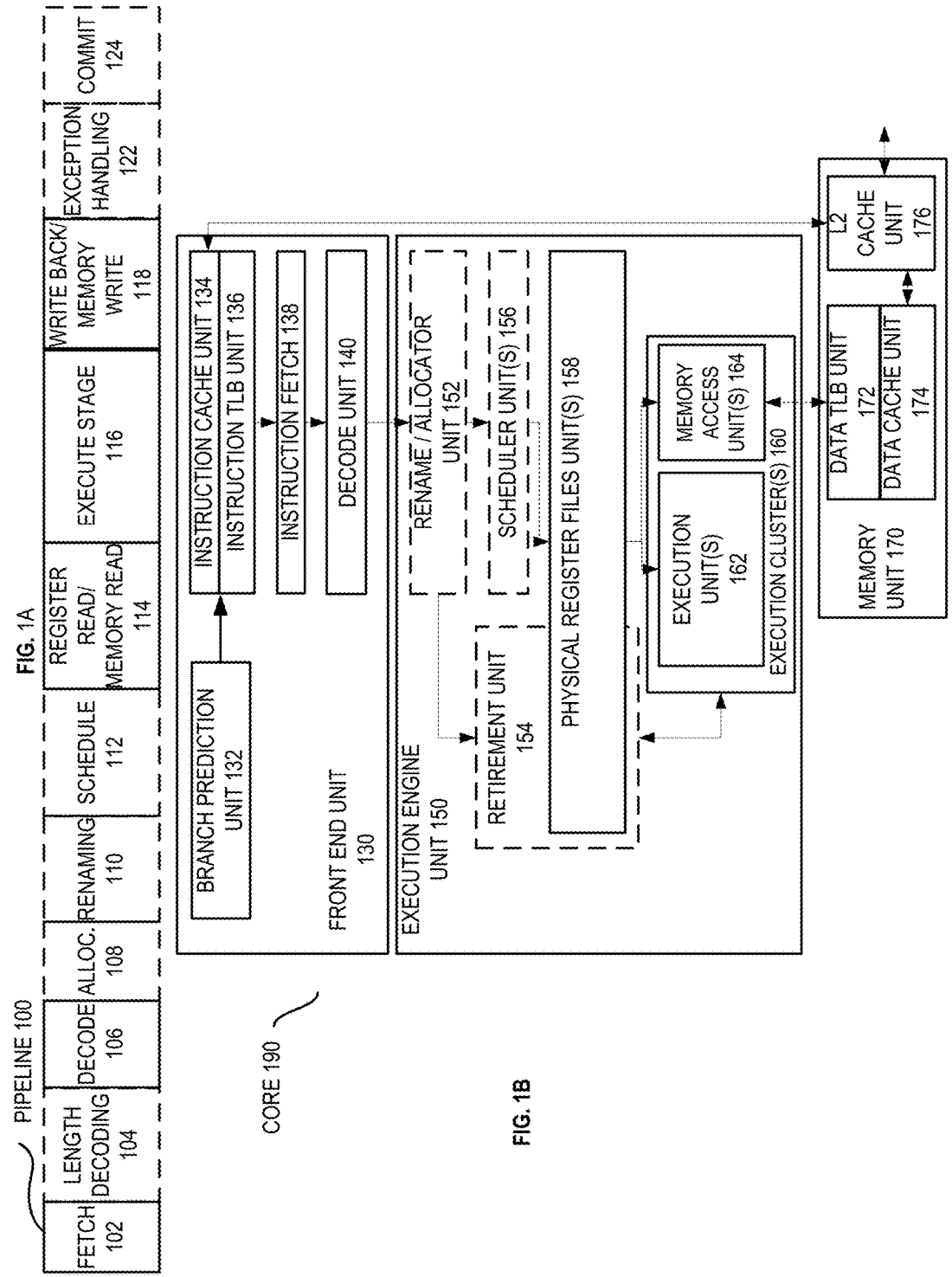
FIG. 1A is a block diagram illustrating both an exemplary in-order fetch, decode, retire pipeline and an exemplary register renaming, out-of-order issue/execution pipeline according to embodiments of the invention.
FIG. 1B is a block diagram illustrating both an exemplary embodiment of an in-order fetch, decode, retire core and an exemplary register renaming, out-of-order issue/execution architecture core to be included in a processor according to embodiments of the invention.

FIG. 1A is a block diagram illustrating both an exemplary in-order fetch, decode, retire pipeline and an exemplary register renaming, out-of-order issue/execution pipeline according to embodiments of the invention. FIG. 1B is a block diagram illustrating both an exemplary embodiment of an in-order fetch, decode, retire core and an exemplary register renaming, out-of-order issue/execution architecture core to be included in a processor according to embodiments of the invention. The solid lined boxes in FIGS. 1A-B illustrate the in-order portions of the pipeline and core, while the optional addition of the dashed lined boxes illustrates the register renaming, out-of-order issue/execution pipeline and core.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2:
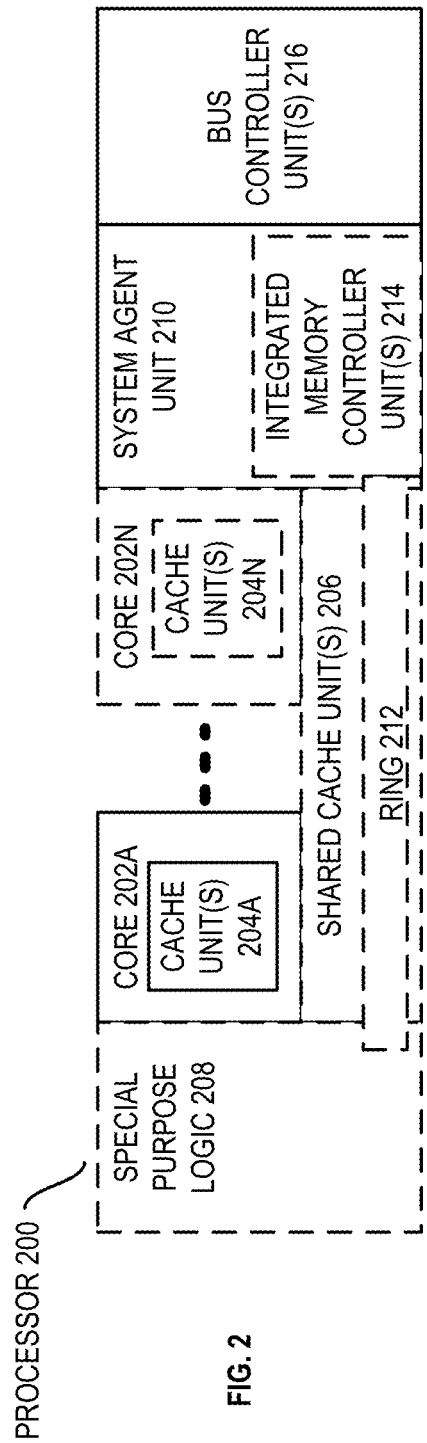
FIG. 2 is a block diagram of a single core processor and a multicore processor with integrated memory controller and graphics according to embodiments of the invention.

FIG. 2 is a block diagram of a processor 200 that may have more than one core, may have an integrated memory controller, and may have integrated graphics according to embodiments of the invention. The solid lined boxes in FIG. 2 illustrate a processor 200 with a single core 202A, a system agent 210, a set of one or more bus controller units 216, while the optional addition of the dashed lined boxes illustrates an alternative processor 200 with multiple cores 202A-N, a set of one or more integrated memory controller unit(s) 214 in the system agent unit 210, and special purpose logic 208.

Thus, different implementations of the processor 200 may include: 1) a CPU with the special purpose logic 208 being integrated graphics and/or scientific (throughput) logic (which may include one or more cores), and the cores 202A-N being one or more general purpose cores (e.g., general purpose in-order cores, general purpose out-of-order cores, a combination of the two); 2) a coprocessor with the cores 202A-N being a large number of special purpose cores intended primarily for graphics and/or scientific (throughput); and 3) a coprocessor with the cores 202A-N being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 206, and external memory (not shown) coupled to the set of integrated memory controller units 214. The set of shared cache units 206 may include one or more mid-level caches, such as level 2 (L2), level 3 (L3), level 4 (L4), or other levels of cache, a last level cache (LLC), and/or combinations thereof. While in one embodiment a ring based interconnect unit 212 interconnects the integrated graphics logic 208, the set of shared cache units 206, and the system agent unit 210/integrated memory controller unit(s) 214, alternative embodiments may use any number of well-known techniques for interconnecting such units. In one embodiment, coherency is maintained between one or more cache units 206 and cores 202-A-N.

In some embodiments, one or more of the cores 202A-N are capable of multi-threading. The system agent 210 includes those components coordinating and operating cores 202A-N. The system agent unit 210 may include for example a power control unit (PCU) and a display unit. The PCU may be or include logic and components needed for regulating the power state of the cores 202A-N and the integrated graphics logic 208. The display unit is for driving one or more externally connected displays.

The cores 202A-N may be homogenous or heterogeneous in terms of architecture instruction set; that is, two or more of the cores 202A-N may be capable of execution the same instruction set, while others may be capable of executing only a subset of that instruction set or a different instruction set. In one embodiment, the cores 202A-N are heterogeneous and include both the "small" cores and "big" cores described below.

FIGS. 3-6 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 3:
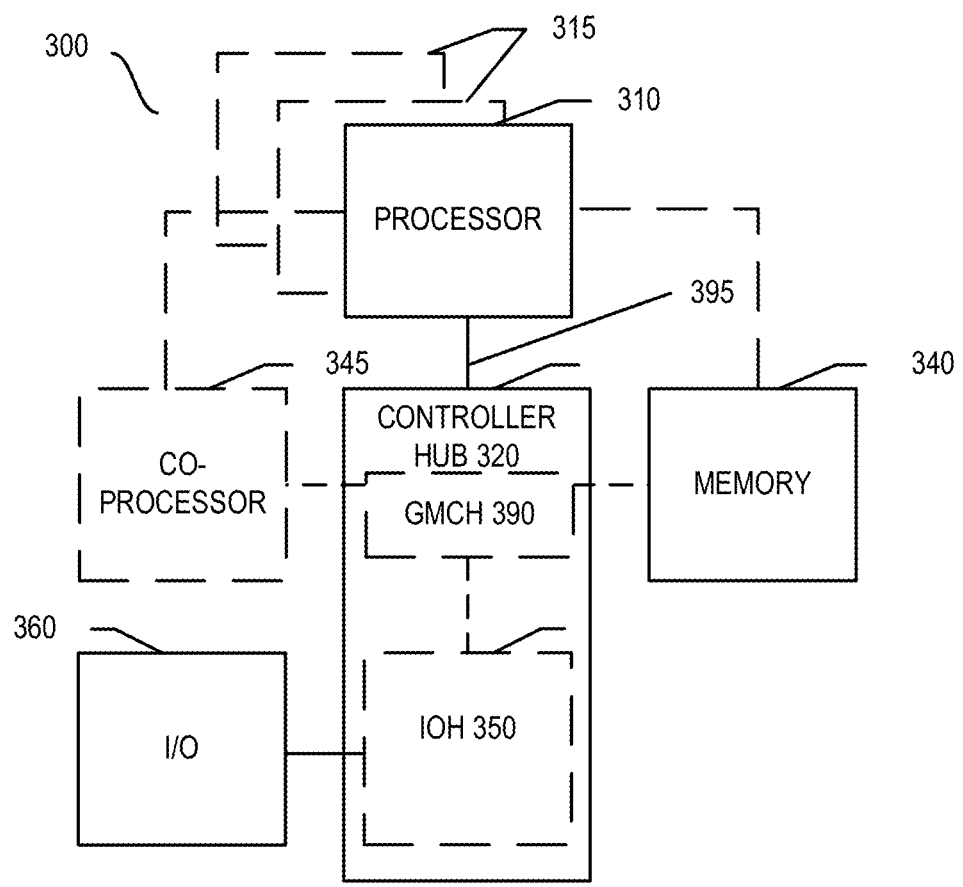
FIG. 3 illustrates a block diagram of a system in accordance with one embodiment of the present invention.

Referring now to FIG. 3, shown is a block diagram of a system 300 in accordance with one embodiment of the present invention. The system 300 may include one or more processors 310, 315, which are coupled to a controller hub 320. In one embodiment the controller hub 320 includes a graphics memory controller hub (GMCH) 390 and an Input/Output Hub (IOH) 350 (which may be on separate chips); the GMCH 390 includes memory and graphics controllers to which are coupled memory 340 and a coprocessor 345; the IOH 350 is couples input/output (I/O) devices 360 to the GMCH 390. Alternatively, one or both of the memory and graphics controllers are integrated within the processor (as described herein), the memory 340 and the coprocessor 345 are coupled directly to the processor 310, and the controller hub 320 in a single chip with the IOH 350.

The optional nature of additional processors 315 is denoted in FIG. 3 with broken lines. Each processor 310, 315 may include one or more of the processing cores described herein and may be some version of the processor 200.

The memory 340 may be, for example, dynamic random access memory (DRAM), phase change memory (PCM), or a combination of the two. For at least one embodiment, the controller hub 320 communicates with the processor(s) 310, 315 via a multi-drop bus, such as a frontside bus (FSB), point-to-point interface such as QuickPath Interconnect (QPI), or similar connection 395.

In one embodiment, the coprocessor 345 is a special-purpose processor, such as, for example, a high-throughput MIC processor, a network or communication processor, compression engine, graphics processor, GPGPU, embedded processor, or the like. In one embodiment, controller hub 320 may include an integrated graphics accelerator.

There can be a variety of differences between the physical resources 310, 315 in terms of a spectrum of metrics of merit including architectural, microarchitectural, thermal, power consumption characteristics, and the like.

In one embodiment, the processor 310 executes instructions that control data processing operations of a general type. Embedded within the instructions may be coprocessor instructions. The processor 310 recognizes these coprocessor instructions as being of a type that should be executed by the attached coprocessor 345. Accordingly, the processor 310 issues these coprocessor instructions (or control signals representing coprocessor instructions) on a coprocessor bus or other interconnect, to coprocessor 345. Coprocessor(s) 345 accept and execute the received coprocessor instructions.

Figure 4:
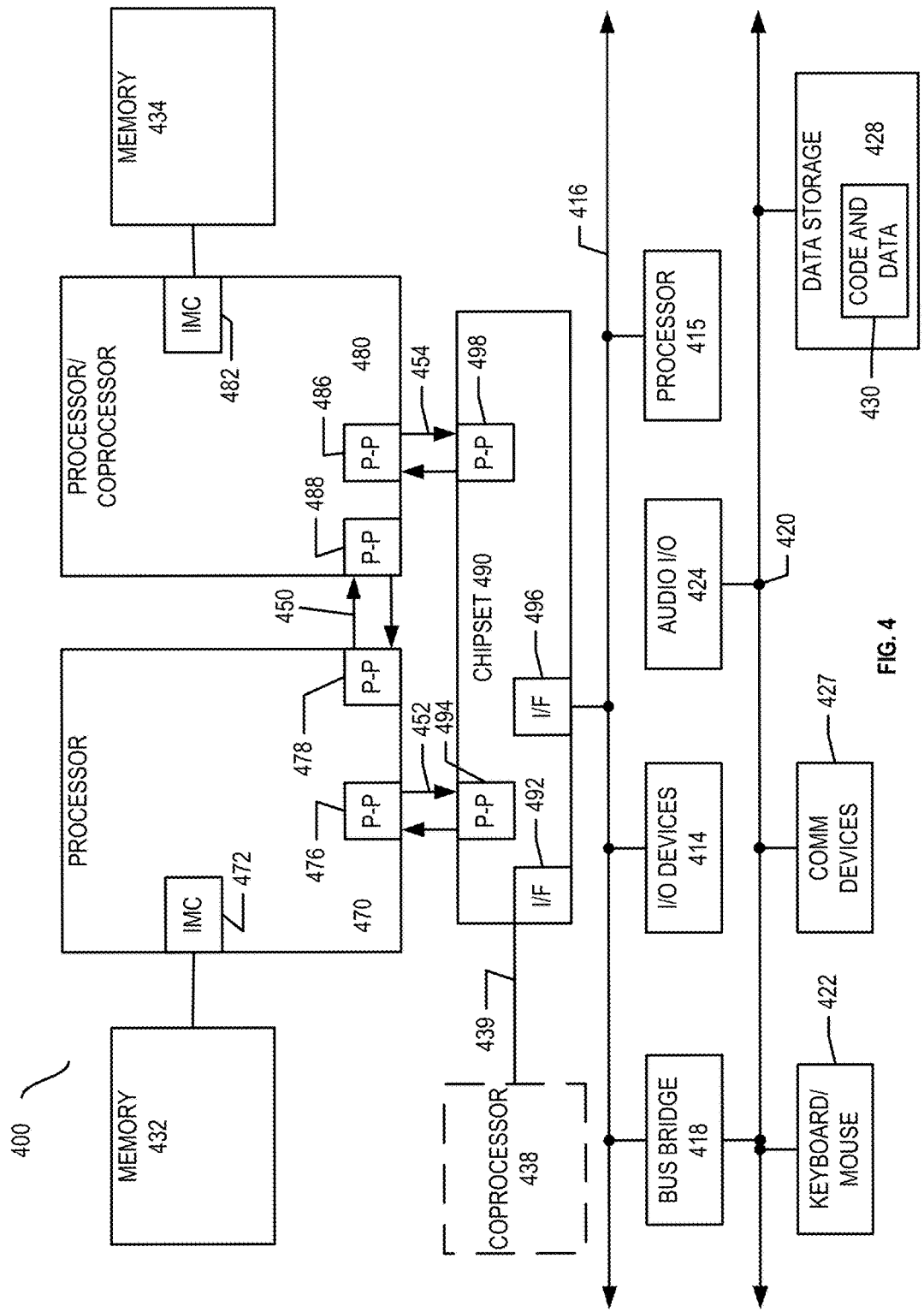
FIG. 4 illustrates a block diagram of a second system in accordance with an embodiment of the present invention.

Referring now to FIG. 4, shown is a block diagram of a first more specific exemplary system 400 in accordance with an embodiment of the present invention. As shown in FIG. 4, multiprocessor system 400 is a point-to-point interconnect system, and includes a first processor 470 and a second processor 480 coupled via a point-to-point interconnect 450. Each of processors 470 and 480 may be some version of the processor 200. In one embodiment of the invention, processors 470 and 480 are respectively processors 310 and 315, while coprocessor 438 is coprocessor 345. In another embodiment, processors 470 and 480 are respectively processor 310 coprocessor 345.

Processors 470 and 480 are shown including integrated memory controller (IMC) units 472 and 482, respectively. Processor 470 also includes as part of its bus controller units point-to-point (P-P) interfaces 476 and 478; similarly, second processor 480 includes P-P interfaces 486 and 488. Processors 470, 480 may exchange information via a point-to-point (P-P) interface 450 using P-P interface circuits 478, 488. As shown in FIG. 4, IMCs 472 and 482 couple the processors to respective memories, namely a memory 432 and a memory 434, which may be portions of main memory locally attached to the respective processors.

Processors 470, 480 may each exchange information with a chipset 490 via individual P-P interfaces 452, 454 using point to point interface circuits 476, 494, 486, 498. Chipset 490 may optionally exchange information with the coprocessor 438 via a high-performance interface 439. In one embodiment, the coprocessor 438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 490 may be coupled to a first bus 416 via an interface 496. In one embodiment, first bus 416 may be a Peripheral Component Interconnect (PCI) bus, or a bus such as a PCI Express bus or another third generation I/O interconnect bus, although the scope of the present invention is not so limited.

As shown in FIG. 4, various I/O devices 414 may be coupled to first bus 416, along with a bus bridge 418 which couples first bus 416 to a second bus 420. In one embodiment, one or more additional processor(s) 415, such as coprocessors, high-throughput MIC processors, GPGPU's, accelerators (such as, e.g., graphics accelerators or digital signal processing (DSP) units), field programmable gate arrays, or any other processor, are coupled to first bus 416. In one embodiment, second bus 420 may be a low pin count (LPC) bus. Various devices may be coupled to a second bus 420 including, for example, a keyboard and/or mouse 422, communication devices 427 and a storage unit 428 such as a disk drive or other mass storage device which may include instructions/code and data 430, in one embodiment. Further, an audio I/O 424 may be coupled to the second bus 420. Note that other architectures are possible. For example, instead of the point-to-point architecture of FIG. 4, a system may implement a multi-drop bus or other such architecture.

Figure 5:
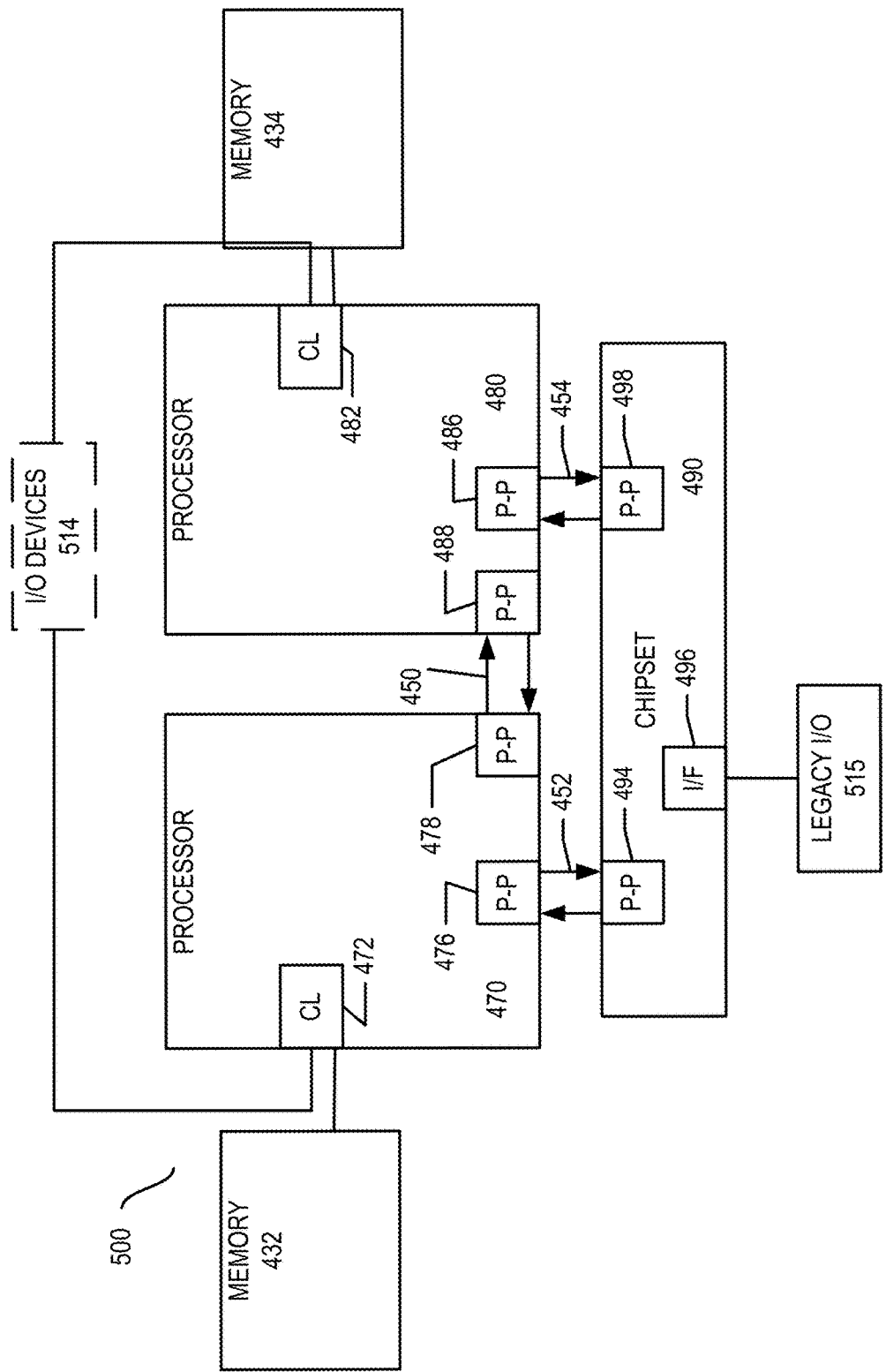
FIG. 5 illustrates a block diagram of a third system in accordance with an embodiment of the present invention.

Referring now to FIG. 5, shown is a block diagram of a second more specific exemplary system 500 in accordance with an embodiment of the present invention. Like elements in FIGS. 4 and 5 bear like reference numerals, and certain aspects of FIG. 4 have been omitted from FIG. 5 in order to avoid obscuring other aspects of FIG. 5.

FIG. 5 illustrates that the processors 470, 480 may include integrated memory and I/O control logic ("CL") 472 and 482, respectively. Thus, the CL 472, 482 include integrated memory controller units and include I/O control logic. FIG. 5 illustrates that not only are the memories 432, 434 coupled to the CL 472, 482, but also that I/O devices 514 are also coupled to the control logic 472, 482. Legacy I/O devices 515 are coupled to the chipset 490.

Figure 6:
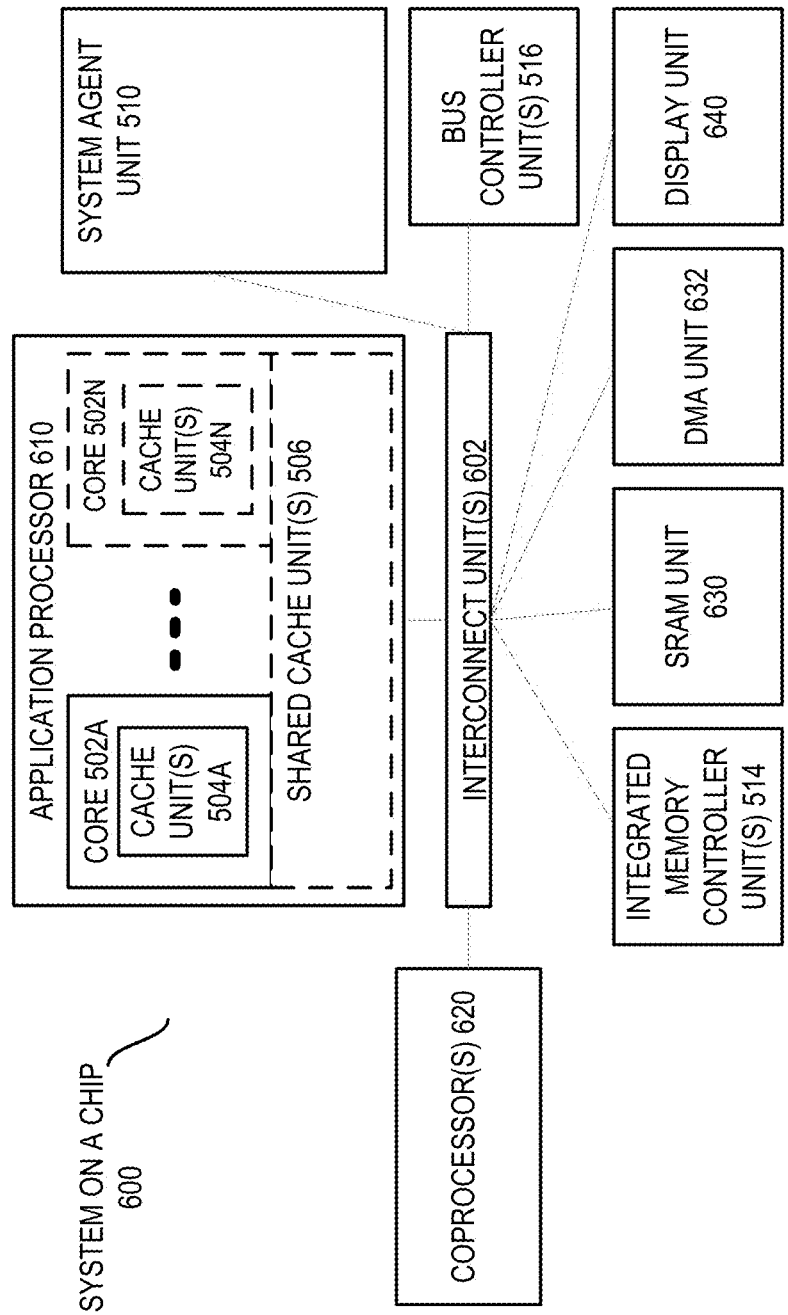
FIG. 6 illustrates a block diagram of a system on a chip (SoC) in accordance with an embodiment of the present invention.

Referring now to FIG. 6, shown is a block diagram of a SoC 600 in accordance with an embodiment of the present invention. Similar elements in FIG. 2 bear like reference numerals. Also, dashed lined boxes are optional features on more advanced SoCs. In FIG. 6, an interconnect unit(s) 602 is coupled to: an application processor 610 which includes a set of one or more cores 202A-N and shared cache unit(s) 206; a system agent unit 210; a bus controller unit(s) 216; an integrated memory controller unit(s) 214; a set or one or more coprocessors 620 which may include integrated graphics logic, an image processor, an audio processor, and a video processor; an static random access memory (SRAM) unit 630; a direct memory access (DMA) unit 632; and a display unit 640 for coupling to one or more external displays. In one embodiment, the coprocessor(s) 620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 430 illustrated in FIG. 4, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 7:
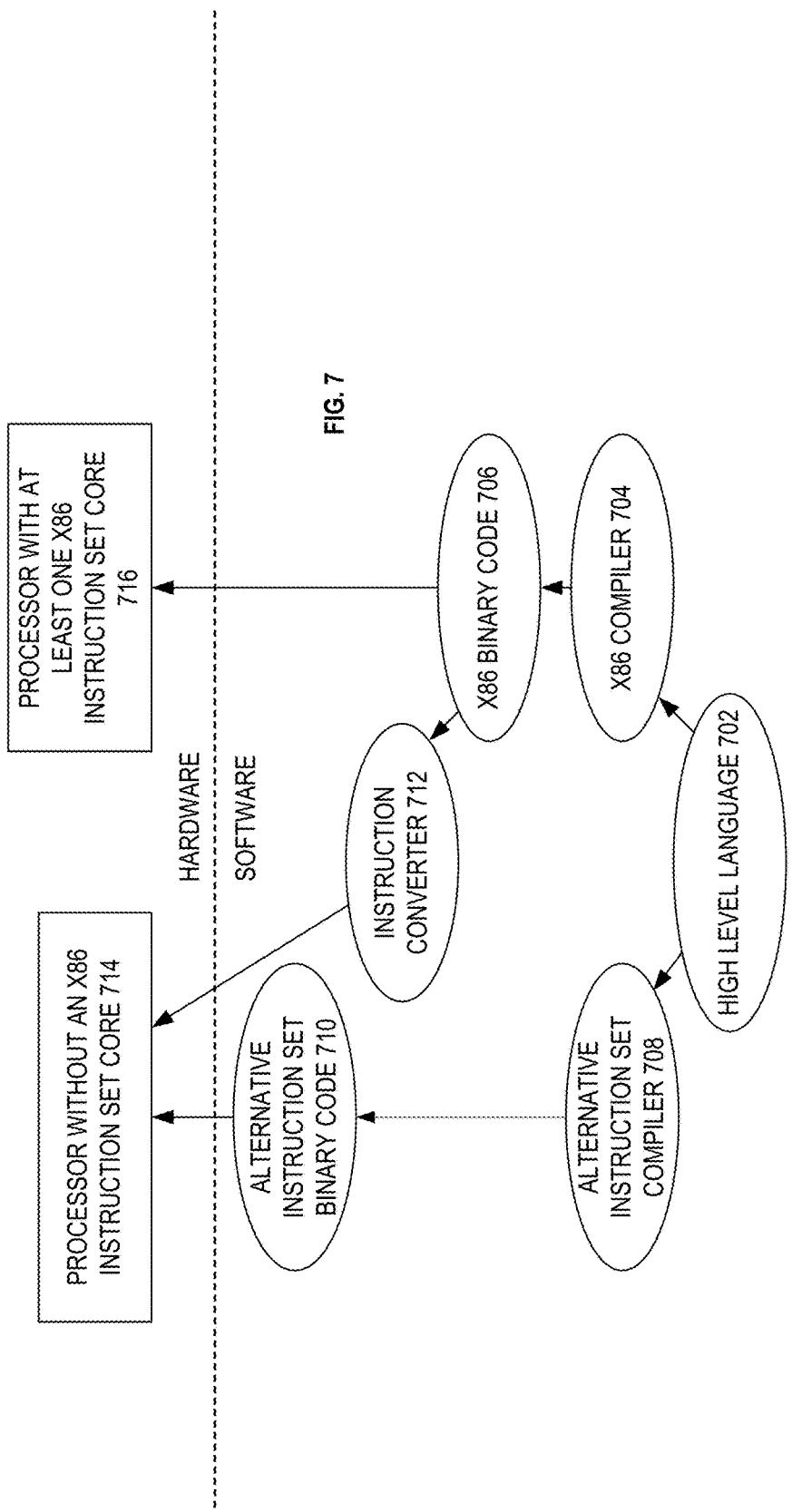
FIG. 7 illustrates a block diagram contrasting the use of a software instruction converter to convert binary instructions in a source instruction set to binary instructions in a target instruction set according to embodiments of the invention.

FIG. 7 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 7 shows a program in a high level language 702 may be compiled using an x86 compiler 704 to generate x86 binary code 706 that may be natively executed by a processor with at least one x86 instruction set core 716. The processor with at least one x86 instruction set core 716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 704 represents a compiler that is operable to generate x86 binary code 706 (e.g., object code) that can, with or without additional linkage processing, be executed on the processor with at least one x86 instruction set core 716. Similarly, FIG. 7 shows the program in the high level language 702 may be compiled using an alternative instruction set compiler 708 to generate alternative instruction set binary code 710 that may be natively executed by a processor without at least one x86 instruction set core 714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 712 is used to convert the x86 binary code 706 into code that may be natively executed by the processor without an x86 instruction set core 714. This converted code is not likely to be the same as the alternative instruction set binary code 710 because an instruction converter capable of this is difficult to make; however, the converted code will accomplish the general operation and be made up of instructions from the alternative instruction set. Thus, the instruction converter 712 represents software, firmware, hardware, or a combination thereof that, through emulation, simulation or any other process, allows a processor or other electronic device that does not have an x86 instruction set processor or core to execute the x86 binary code 706.

Method and Apparatus for Reverse Memory Sparing

Current memory controllers are only able to spare at a single granularity, which is "rank" granularity, and only in the forward direction. In contrast, the embodiments of the invention described below are capable of memory sparing at multiple granularities such as: bit, device, cacheline, row, column, bank, rank, and dual inline memory module (DIMM). This poses the problem of moving the failure state between different granularities. With multiple sparing granularities available, sequential hard failures may reveal a previous sparing decision to be a suboptimal one.

To address this problem, one embodiment of the invention is capable of undoing forward sparing actions, referred to as "reverse sparing." As used herein, reverse sparing is the moving of the failure state backwards, i.e., from the n+1 failure state to n failure state. Reverse sparing enables the traversal both forwards and backwards between Reliability, Availability, and Serviceability (RAS) states which allows the memory controller to keep the memory in the most optimal RAS state over multiple sequential DRAM failures. With a forward-only sparing design, the memory could not be kept in the most optimal RAS state, leading to increased service costs. This makes the reverse sparing techniques described herein an essential building block of next generation RAS flows which increase memory reliability and decrease OEM's service costs.

As used herein, "forward sparing" is defined as physically moving data from a failed region of memory and storing it in new location where subsequent accesses to that data will be retrieved from the new location and not the failed location. "Reverse sparing" is physically moving data from the new location back to the original failed location. Typically, reverse sparing will be done with the intent of subsequently forward sparing at a more optimal granularity. Interim errors between the reverse sparing and subsequent forward sparing operation resulting from temporarily moving data back to the failed location are corrected by error correction code (ECC) techniques.

Figure 8:
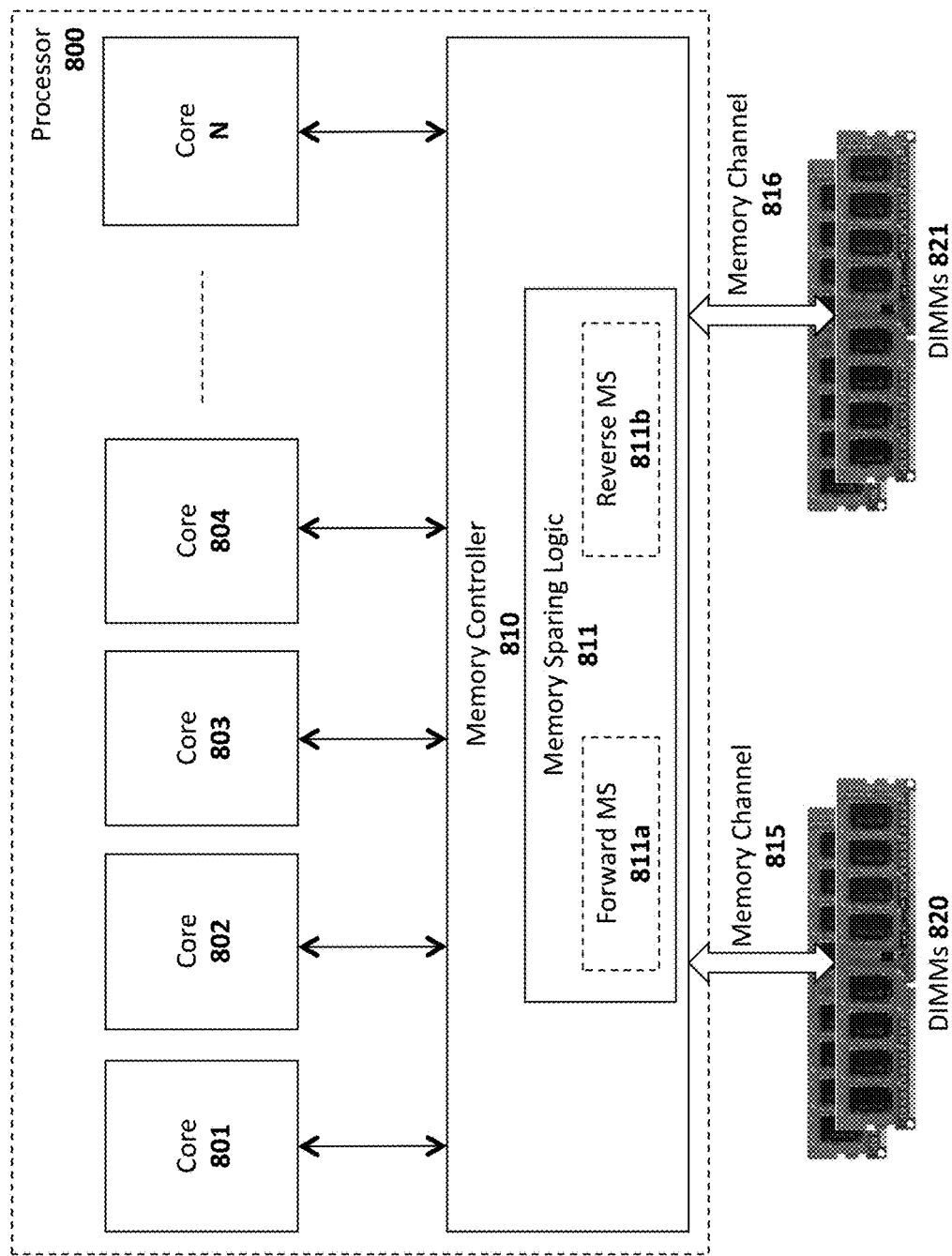
FIG. 8 illustrates one embodiment of a processor architecture including a memory controller with memory sparing logic.

As illustrated in FIG. 8, a processor architecture on which the embodiments of the invention may be implemented may include a plurality of cores 801-804, N and at least one memory controller 810 with memory sparing logic 811 for implementing the forward/backward sparing techniques described herein. In particular, the memory sparing logic 811 includes a forward memory sparing component 811a for performing forward memory sparing operations and a reverse memory sparing component 811b for performing reverse memory sparing operations as described below. The memory controller 810 is communicatively coupled to a first set of DIMMs 820 over a first memory channel 815 and a second set of DIMMs 821 over a second memory channel 816.

While the structures of DIMM, Rank, Bank, Device, Row and Column described herein refer specifically to the DDR (Double Data Rate) memory specification maintained by Joint Electron Device Engineering Council (JEDEC), of which the latest generation is DDR4, the embodiments of the invention can and will be applied to any and all memory technologies including but not limited to DRAM, SRAM, phase-change memory, and Flash, to name just a few, which may reside inside and/or outside the processor or processor package.

Figure 9:
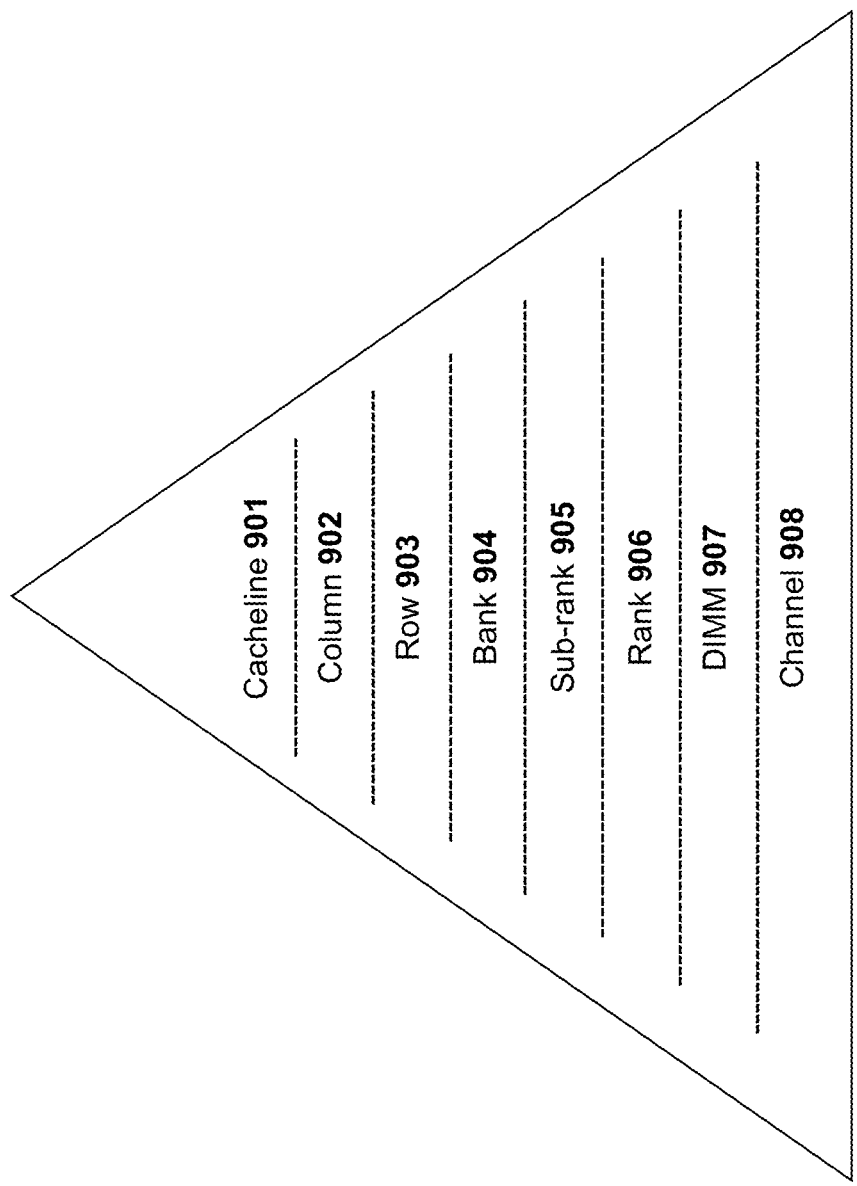
FIG. 9 illustrates a hierarchy of memory sparing levels, each having a different granularity.

Each memory failure may be thought of as having 1) a particular region affected and 2) a width (number of bits) affected. An exemplary region size hierarchy for DDR4 is illustrated in FIG. 9, and includes a cacheline 901, column 902, row 903, bank 904, sub-rank 905, rank 906, DIMM

907, and channel 908, from smallest to largest. Thus, in this embodiment, the smallest unit achievable is the cacheline, the size of a single memory request, which is addressed by a single system address.

Figure 10:
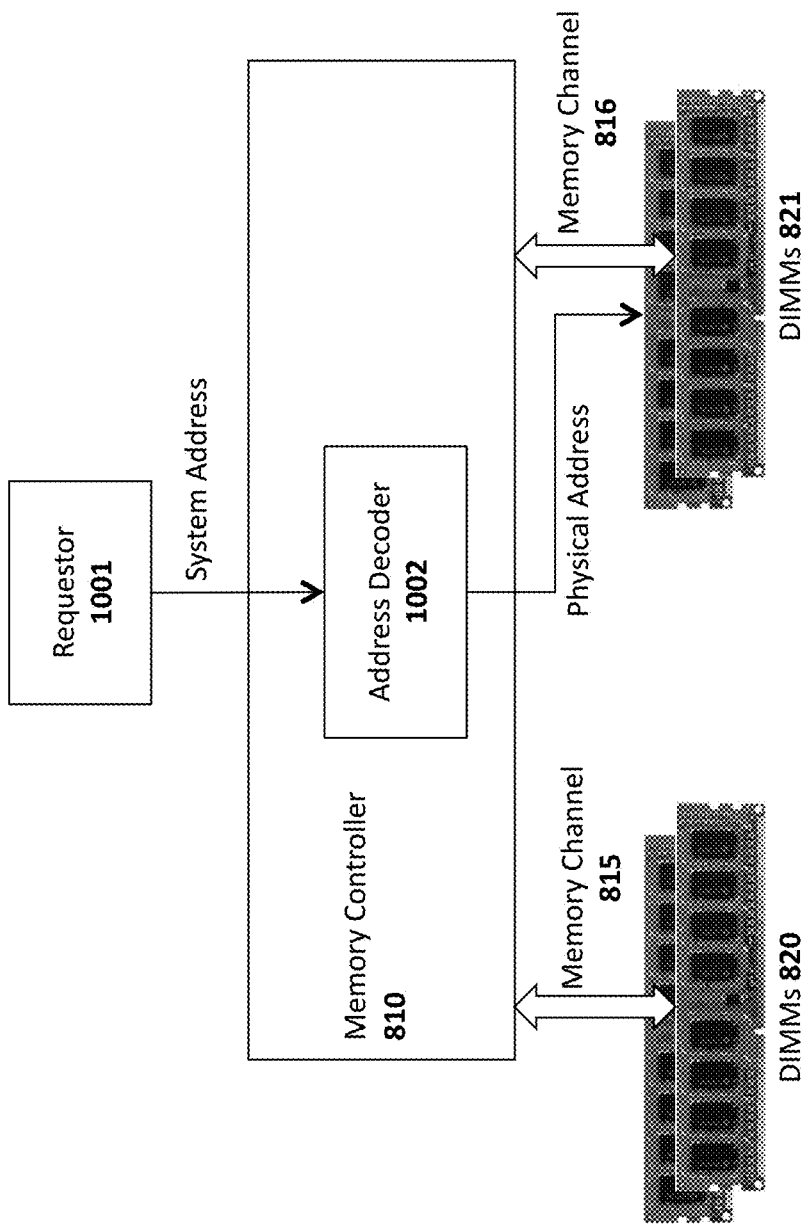
FIG. 10 illustrates an exemplary address decoder in a memory controller decoding a system address to a physical memory address.

As illustrated in FIG. 10, the system address generated by a requestor 1001 (e.g., one of the cores 801-N) is passed through an address decoder 1002 in the memory controller 810 which translates it to a physical address to address the physical location in memory 820-821 where the data resides. Therefore any specific region in memory may be defined as a specific subset of the system address space and/or a specific subset of the physical address space to implement the sparing techniques described herein. The size of the supported sparing regions may be adapted to the basic structures of the underlying memory technology.

Figure 11:
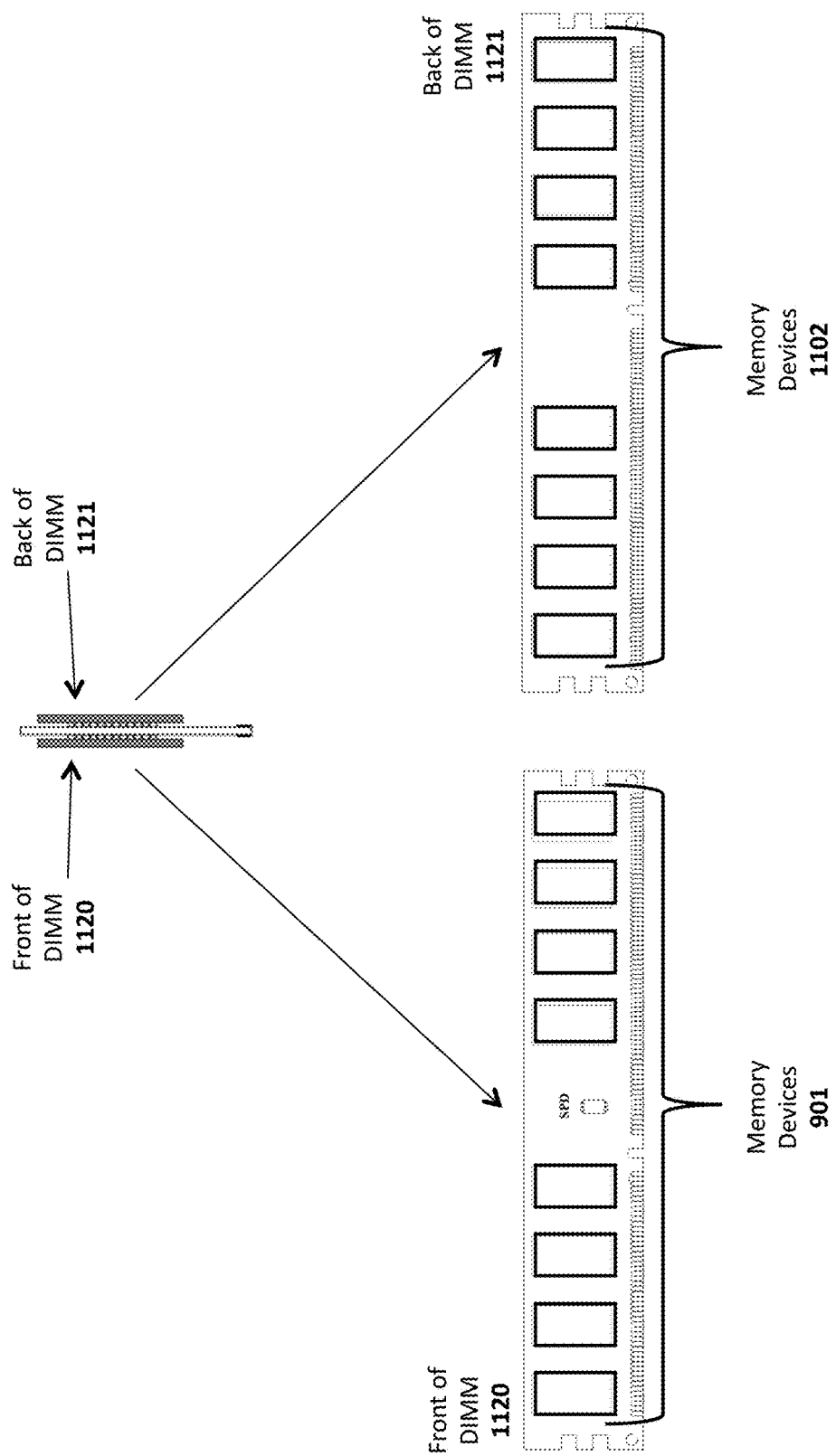
FIG. 11 illustrates memory devices on the front and back of a dual inline memory module (DIMM)

As illustrated in FIG. 11, each DIMM typically includes a first set of memory devices 1101 (e.g., individual memory chips) on its front side 1120 and a second set of memory devices on its back side 1121. In the example shown in FIG. 11, there are 8 memory devices 1101-1102 on the front and back of the DIMM, respectively (for a total of 16 memory devices per DIMM). The memory devices may be assigned to "ranks" in which each rank shares the same address and data buses as the other ranks. For example, on some DIMMs, the set of memory devices 1101 on the front of the DIMM are assigned to Rank0 and the set of memory devices 1102 on the back of the DIMM are assigned to Rank1. All memory devices may be assigned to a single rank on other DIMMs (e.g., Rank0). Since all ranks share the same buses, only one rank may be accessed at any given time, typically specified by activating the corresponding rank's chip select (CS) signal. All other ranks are deactivated for the duration of the operation by having their corresponding CS signals deactivated. DIMMs are commonly manufactured with up to four ranks per module.

The number of chips included in a "rank" is based on the bit width of each of the memory devices 1101-1102 shown in FIG. 11 and the size of the DDR bus. For example, if the total DDR bus with is 64 bits, and each chip is O-bits wide (indicated using the "×4" designation) then without ECC, a X4 Non-ECC DIMM requires 16 memory devices in a Rank (16*4=64). If the DIMM shown in FIG. 11 were this type of DIMM, then all 16 chips on the front 1120 and back 1121 would be included in the same rank. In contrast, in a Non-ECC Dual-Rank X8 DIMM, the chip width is 8 bits and would therefore require 8 memory devices in a Rank (8×8=64). Thus the 8 memory devices 1101 on the front of the DIMM 1120 in FIG. 11 would represent one rank (e.g., Rank0) and the 8 memory devices 1102 on the back of the DIMM 1121 would represent another rank (e.g., Rank1). For ECC, an additional 8 bits are added for a 72 bit DDR bus. Consequently, an X8 ECC DIMM would require 9 Devices in a Rank (9*8=72) and an X4 ECC DIMM would require 18 Devices in a Rank (18*4=72).

Figure 12A:
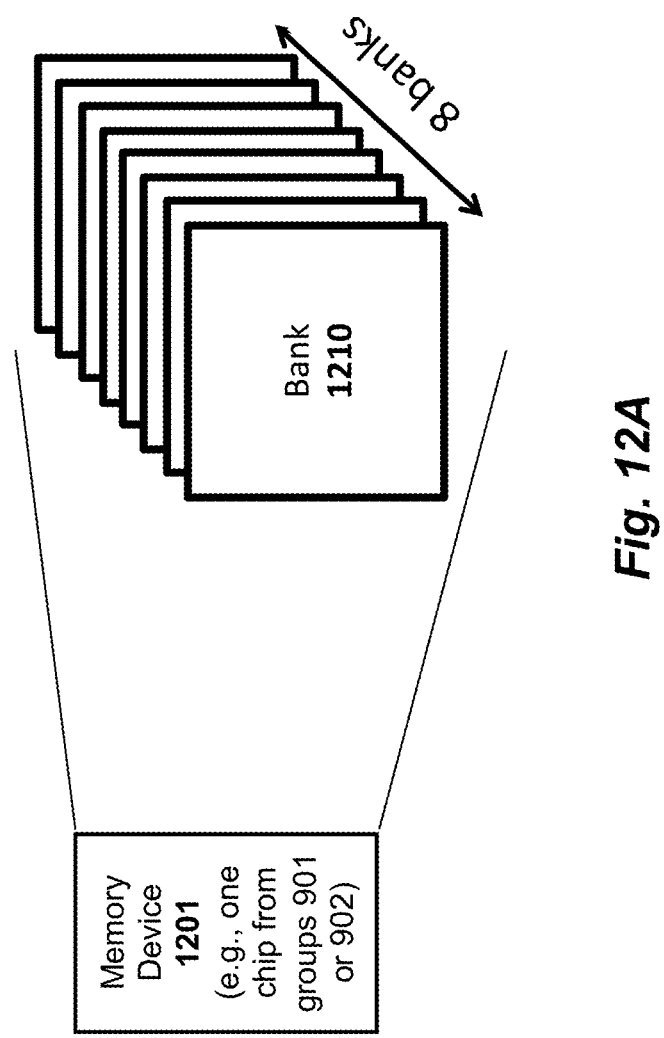
FIG. 12A-C illustrate one embodiment of a memory device comprising a plurality of memory banks and different ways for physically mapping the banks to the bus.

The next level of granularity down from a rank comprises an individual memory device (e.g., one of the 8 memory devices 1101 or 1102) and each memory device comprises a set of memory "banks." FIG. 12A illustrates one particular example in which each memory device 1201 comprises a set of 8 memory banks 1210. Finally, portions of each individual bank 1210 may be addressed using "rows" and "columns." In operation, different portions of a physical memory address generated by the memory controller 811 may identify a particular channel DIMM, rank, device, bank, row, and column.

As mentioned above, in one embodiment of the invention, the memory sparing logic 811 is configured to perform memory sparing operations in both the forward and reverse directions. For example, the memory sparing logic 811 may initially perform a forward sparing operation in response to a detected memory failure at a first level of granularity, such as the bank level, moving the failure state from n to n+1. It may then detect failure conditions at a higher level of granularity, such as at the memory device or the rank level. In response, one embodiment of the memory sparing logic 811 performs a reverse sparing operation, moving the failure level from n+1 back to n and then performing forward sparing at a the higher level of granularity (the device level or rank level), thereby moving from the n to a new n+1 state at the higher level of granularity.

Similarly, the memory sparing logic 811 may detect a failure and initially perform forward sparing at a relatively higher level of granularity such as the rank level, then perform a reverse sparing operation followed by a forward sparing operation at a lower granularity. For example, the specific device or bank causing the failure may later be identified and, in response, the memory sparing logic 811 may perform reverse sparing to move the failure state back from n+1 (rank) to n. It may then perform forward sparing to move the failure state from n to a new n+1 at the more precise level of granularity (e.g., device or bank). The memory sparing logic 811 may be configured to perform the above forward/reverse sparing operations to transition between any two levels of granularity (e.g., moving from the device level to the rank level, from the rank level to the DIMM level, etc).

Figure 12B:
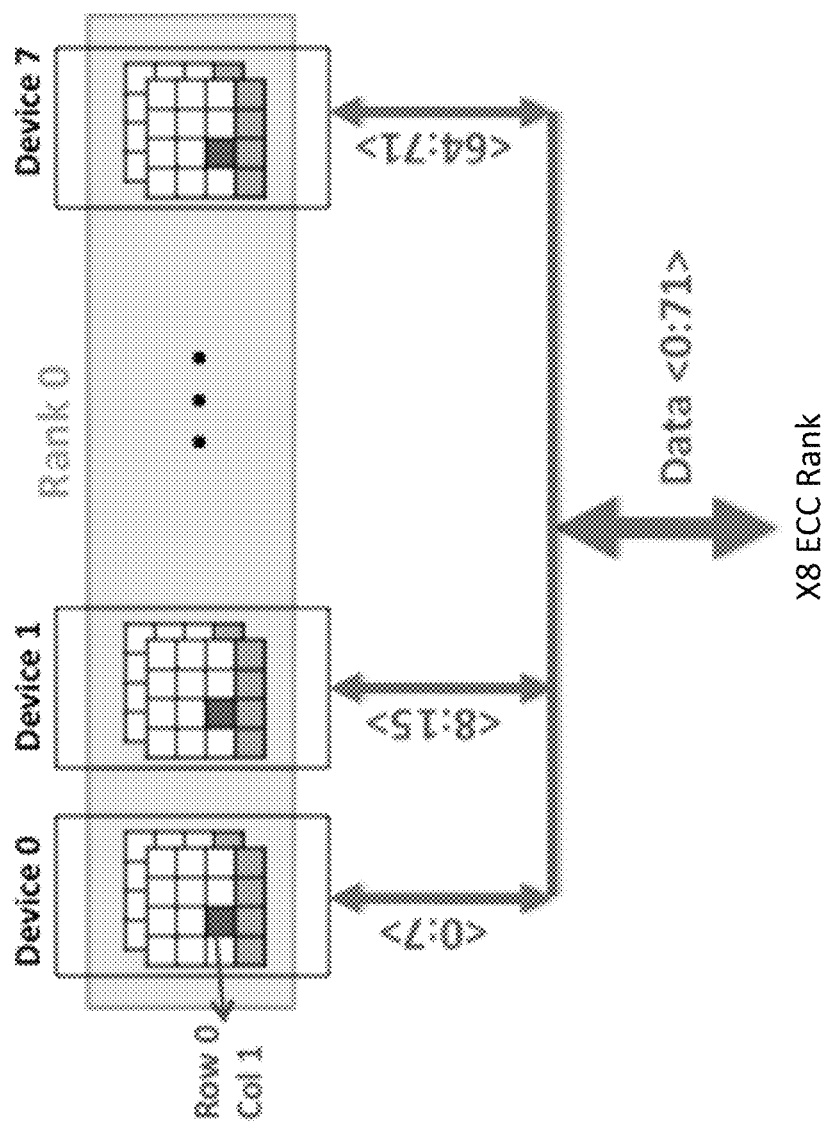

The width of the failure is a specific number of bits on the memory bus, typically 1, 4, or 8 bits. Typical failures will be lane failures where a single bit has failed on the bus, or device failures where the entire width of 1 device has failed (4 consecutive bits for X4 devices and 8 consecutive bits for X8 devices). The mapping of the devices to the bus is shown in FIG. 12B for an X8 ECC Rank and in FIG. 12C for an X4 ECC Rank). In one embodiment, each sparing operation (forward or reverse) will operate on a granularity defined as x, y where x=region size and y=width.

Figure 13A:
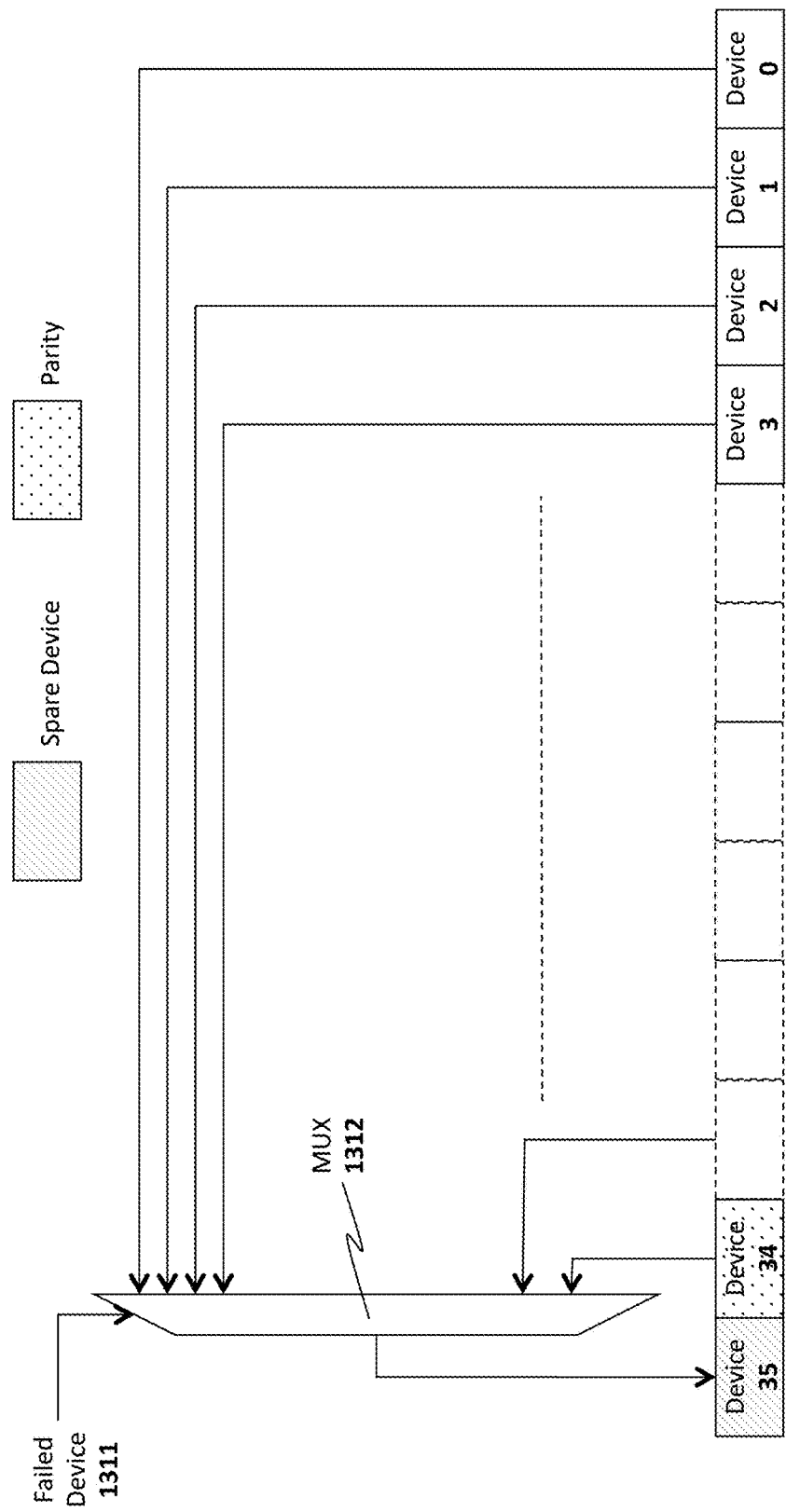
FIG. 13A illustrates memory sparing logic in accordance with one embodiment of the invention for writing to a spare memory device.
Figure 13B:
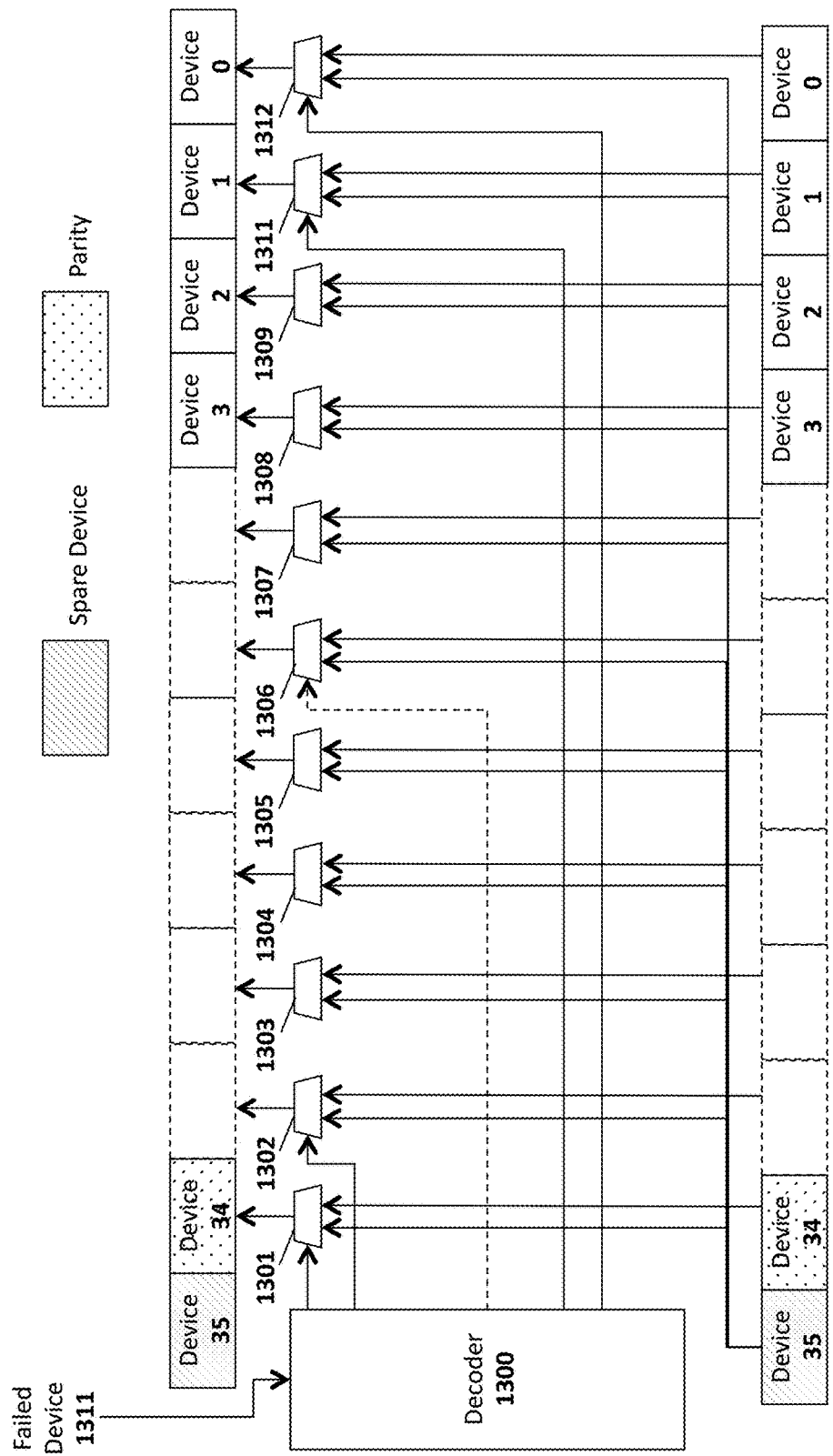
FIG. 13B illustrates memory sparing logic in accordance with one embodiment of the invention for reading a spare memory device.

In one embodiment of the invention, the memory sparing logic 811 implements a write path as shown in FIG. 13A and a read path as shown in FIG. 13B when writing and reading a cache line, respectively, using a spare device. In particular, in this example, a cache line is stored across 36×4 DRAM devices and one of the 36 devices is reserved as a spare device—device 35 in the example. When a device failure occurs, such as within device 34 in the example, the memory sparing logic 811 initiates a memory sparing transaction for each cache line on the rank which reads the memory device, moves data from the failed device to the spare device, and writes the memory. As described below, a reverse spare operation temporarily moves the data from the spare device 35 back to the failed device 34.

Thus, in FIG. 13A, in response to write operation causing a cache line to be written to memory, the identity of the failed device 1311 is provided to logic 1312 implemented as a multiplexer in one embodiment, which physically writes the portion of the cache line that would normally have been written to the failed device 34 to the spare device 35. In this embodiment, memory sparing logic 811 tracks the current state of each device as well as an indication as to which device 34, or portions thereof have failed (e.g., which specific bank within device 34 has failed). In response to the write operation, the memory sparing logic 811 then maps the write operations to the appropriate spare device 35, or portion thereof (e.g., the specific bank(s) in device 35 which have replaced the failed bank(s) in device 34).

As illustrated in FIG. 13B, in response to a read operation reading the cache line from memory, a decoder 1300 decodes the ID of the failed device 34 to determine that the portion of the cache line which would have been stored in the failed device 34 is actually stored in the spare device 35. As such, the data from spare device 35 must be moved into the correct position when returning the result of the read operation to the processor (i.e., as if it actually had been read from device 34). This is accomplished in FIG. 13B by the decoder 1300 controlling a set of multiplexers 1301-1312, each having the spare device as one possible input, and each of the non-spare devices 0-34 as other possible inputs. Assuming that device 34 or a particular bank within device 34 has failed, this information will be specified to the decoder 1300 via the failed device signal 1311 and, in response, the decoder 1300 will output a signal to multiplexer 1301 to select the output from device 35 rather than device 34. The output of multiplexer 1301 is in the device 34 position, thereby ensuring that the portion of the cache line provided from device 35 is output to the processor in the correct position.

As mentioned, in one embodiment, the failed device signal 1311 may specify different levels of granularity for failure. For example, it may specify that an entire device 34 has failed, thereby causing the entire contents of the failed device to be transferred to the spare device 35 to be used. Alternatively, it may specify that only certain banks within device 34 have failed, thereby transferring only these specific banks to the spare device 35. In other embodiments, the failed device signal 1311 may operate at an even lower level of granularity (e.g., identifying specific rows within a specific bank which have failed).

Figure 12C:
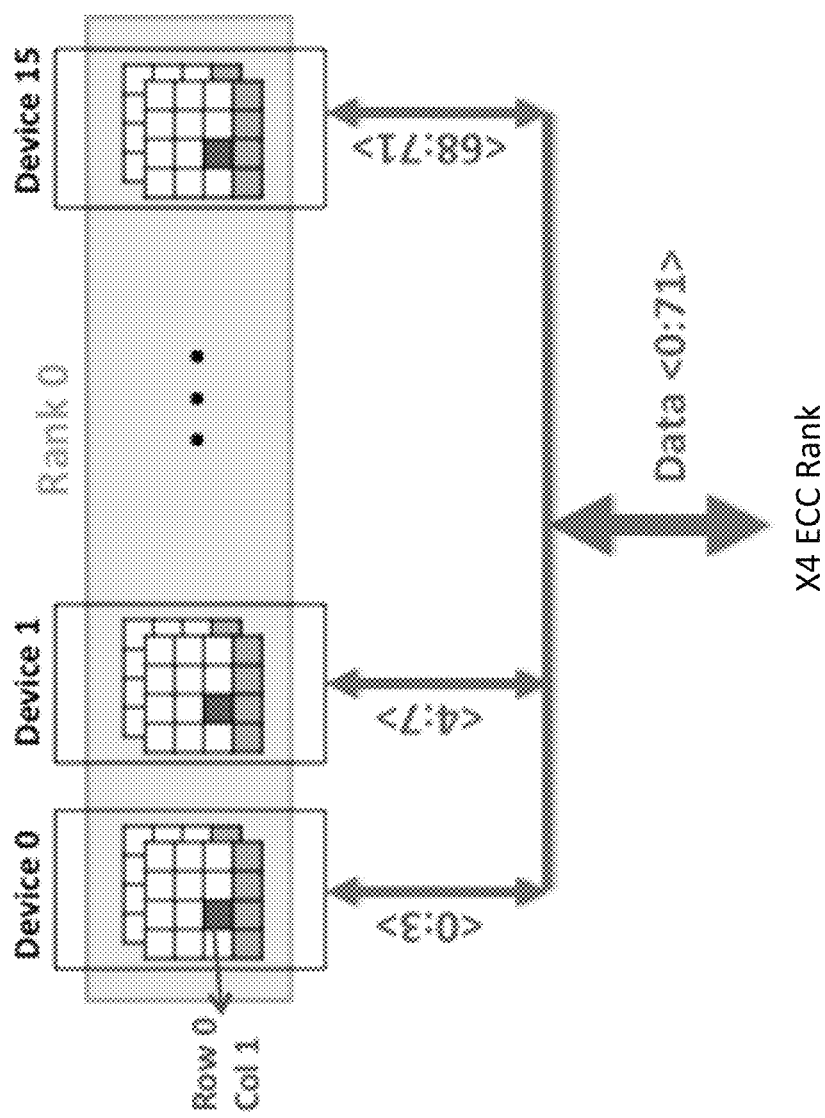
Figure 14A:
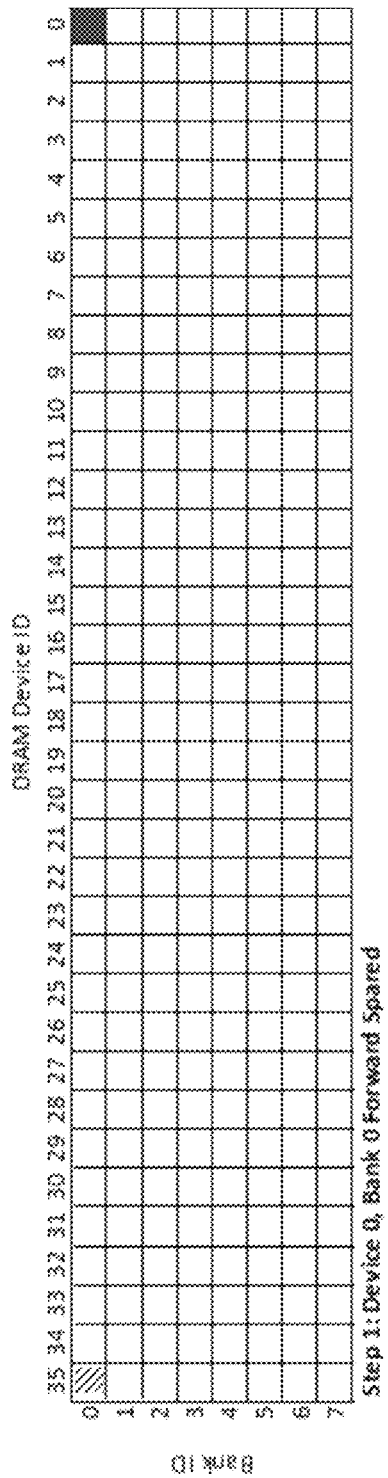
FIGS. 14A-C illustrates one embodiment in which forward memory sparing is performed at a first granularity and at a second granularity, separated by a reverse memory sparing operation.
Figure 14B:
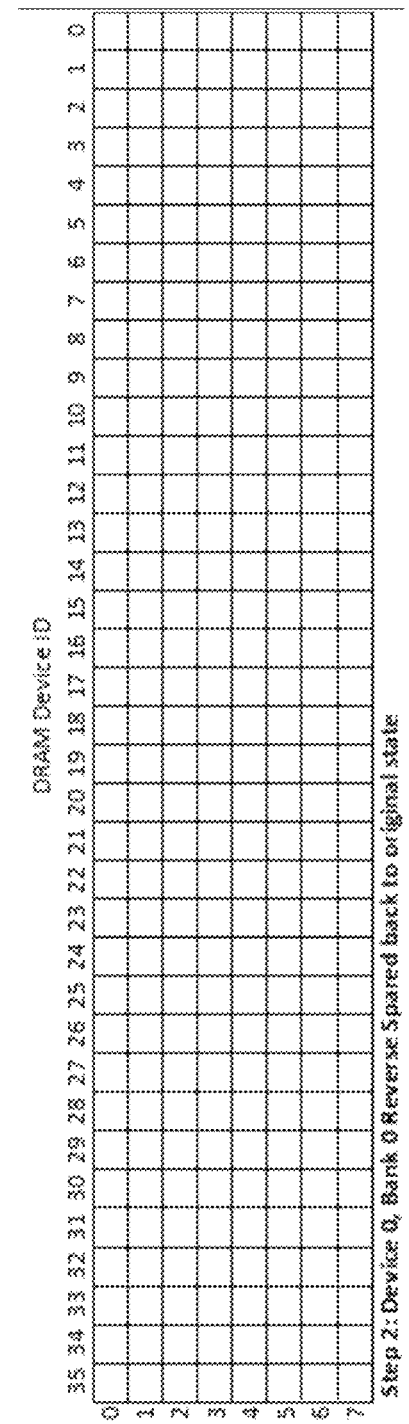
Figure 14C:
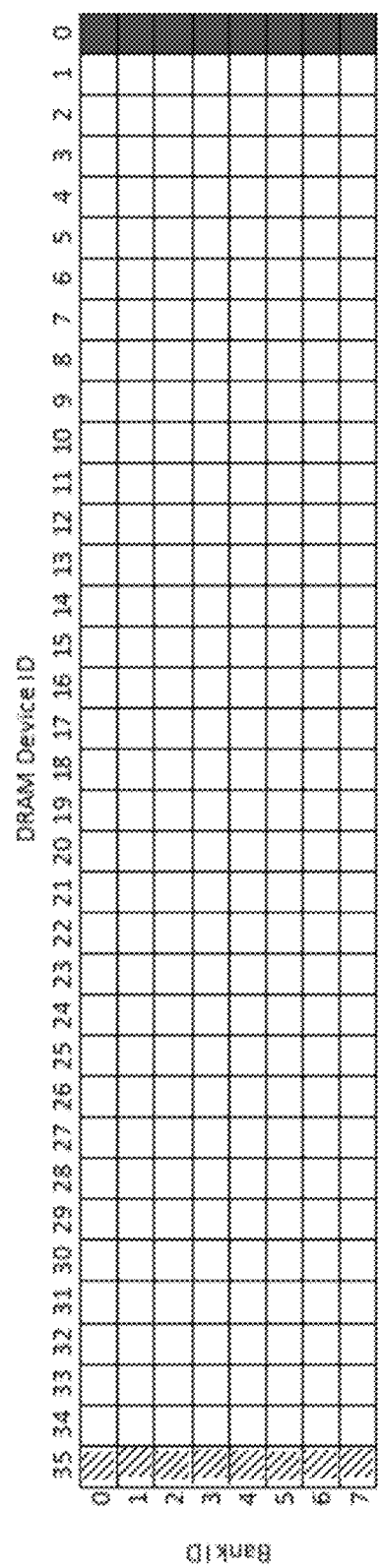

FIGS. 14A-C illustrate how forward and reverse sparing may be employed in accordance with one embodiment of the invention. In FIG. 14A, bank 0 of device 0 has failed. In response, the memory sparing logic 811 has utilized bank 0 of device 35 as a spare for bank 0 of device 0. Subsequently, it has been determined that the failure within device 0 extends beyond bank 0 and, as such, the entire device 0 needs to be spared. Thus, in one embodiment, the memory sparing logic 811 performs a reverse sparing operation, temporarily moving the contents of bank 0, device 35 back to bank 0 or device 0, as shown in FIG. 14B. Once the reverse sparing operation is complete, the memory sparing logic 811 moves the entire contents of device 0 (i.e., banks 0-7) to the spare device 35, as shown in FIG. 12C.

Thus, FIGS. 14A-C illustrate the transition of a bank failure to a rank failure in 3 steps using reverse sparing as an intermediate step (FIG. 14B). In one embodiment, this is performed using a logical double device data correction (DDDC) rank with 36×4 DRAM devices (0-35), which is 2 physical ranks (18 devices each) running in lockstep. It is shown in DDR3 technology which has 8 banks per rank.

Prior systems do not include a mechanism to reverse spare in this manner. As such, once the single bank is spared as in FIG. 14A, these systems lack the ability to subsequently spare the enter device as shown in FIG. 14C. By giving the memory controller the ability to transition forwards and backwards between RAS states, reverse sparing becomes an essential building block for advanced RAS flows which increase memory reliability and decrease OEM service costs.

Figure 15:
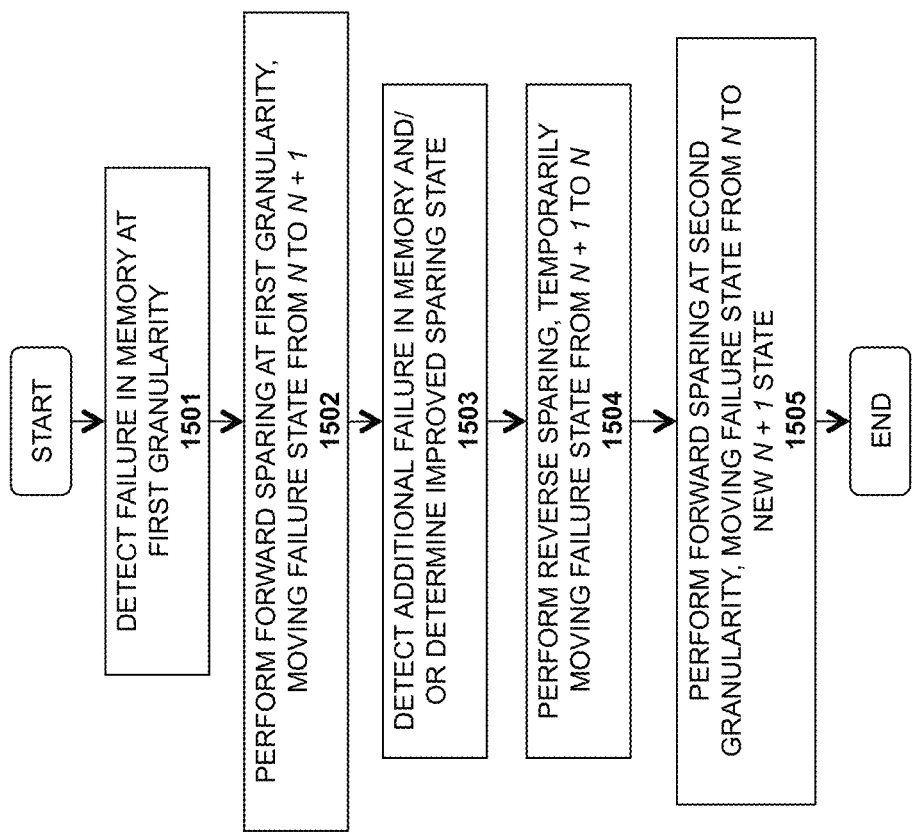
FIG. 15 illustrates a method in accordance with one embodiment of the invention.

A method in accordance with one embodiment of the invention is illustrated in FIG. 15. The method may be implemented within the context of the memory architectures described above, but is not limited to any particular memory architecture.

At 1501, a failure is detected in memory at a first granularity (e.g., at the bank level). In response, forward sparing is performed at 1502, moving the failure state from n to n+1 as described above (e.g., moving the failed bank(s) to spare bank(s) of a spare device). At 1503, additional failures are detected in the memory and/or an improved (e.g., more optimal) sparing state is identified. For example, it may be determined that additional banks within the device have failed (e.g., as described above with respect to FIGS. 12A-C). Alternatively, it may be determined that the initial level of granularity at which sparing was performed was too aggressive, sparing at a higher granularity than required. For example, the entire memory device may initially be spared, but after monitoring the memory, it may be determined that only a single bank in the memory device caused the failure. In either case, at 1504, reverse sparing is performed to temporarily move the failure state from n+1 to n (i.e., the state in which the memory resided prior to the forward sparing operation as illustrated in FIG. 12B). Once the reverse sparing operation is complete, at 1505, a second forward sparing operation is performed at a second granularity in accordance with the determination from 1503, moving the failure state from n to a new n+1 state (e.g., moving from a single bank to an entire device or vice versa, depending on the analysis at 1503).

Three exemplary use cases of reverse sparing are provided below. In each use case, the benefits of reverse sparing are highlighted.

Use Case 1:

In this example, reverse device sparing is used in the RAS flow for "Bank DDDC" on an Intel™-based Server (e.g., a server with a Haswell processor and supporting chipset). One example of DDDC Device sparing is depicted in FIGS. 13A-B. While DDDC maps out DRAM failures at the Rank granularity, Bank DDDC allows the mapping out of failures at the smaller, Bank granularity. Specifically, one embodiment supports either mapping out of devices on 2 Banks per Rank, OR mapping out of a device on the entire Rank. When a DRAM device failure occurs which only affects a single bank, that bank will be forward spared to map out the bad device. If the same device failure later degrades to affect the entire rank, the entire rank needs to be spared. Reverse Sparing is then used to transition the bank failure to rank failure by first reversing the original bank spare, then forward sparing the entire rank. This is depicted in FIGS. 14A-C.

The benefit of this configuration is that with the addition of bank granular sparing, reverse sparing was invented to transition the granularity of the failed region. Reverse sparing may be used when a bank failure subsequently turns into a rank failure (or a second bank within the same device fails). After the bank to rank transition via reverse sparing, the rank may sustain an additional device failure by enabling SDDC (parity substitution) before a service call is required. If reverse sparing were not supported, the Bank to Rank sparing transition would not be possible. The only choice would be to enable SDDC on the remaining banks and a service call would be required immediately. In this case, reverse sparing allows the rank to sustain more hard failures before a service call is required.

Use Case 2:

Post silicon verification has to cover all combination of failures at all granularities. RAS flows are becoming more advanced, and reverse sparing enables fast and continuous transitions back and forth between RAS states. Without reverse sparing, reboots are necessary between test cases to reset the memory back to initial state, which add greatly to test time/cost.

Post-silicon memory RAS verification is thereby improved by decreased test time and increased test coverage. This can lead to faster time to market and fewer RAS bugs escaping which would require additional CPU steppings or errata.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the Figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.).

In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

What is claimed is:

1. A processor comprising:
    forward memory sparing logic circuitry to perform a first forward memory sparing operation at a first level of granularity in response to detecting a memory failure;
    reverse memory sparing logic circuitry to perform a reverse memory sparing operation in response to a determination of an improved sparing state having a second level of granularity; and
    the forward memory sparing logic circuitry to responsively perform a second forward memory sparing operation at the second level of granularity.

2. The processor as in claim 1 wherein the improved sparing state is to be determined in response to one or more additional memory failures.

3. The processor as in claim 1 wherein the first forward memory sparing operation is to cause a move from an N failure state to an N+1 failure state; the reverse memory sparing operation is to cause a move from the N+1 failure state back to the N failure state; and the second memory sparing operation is to cause to move from the N failure state to a new N+1 failure state.

4. The processor as in claim 1 wherein the first level of granularity comprises a memory bank and the second level of granularity comprises a memory device.

5. The processor as in claim 1 wherein each of the first level of granularity and the second level of granularity are selected from a group consisting of a bit, a device, a cache line, a row, a column, a bank, a rank, and a DIMM.

6. The processor as in claim 1 further comprising:
    a plurality of cores to execute program code and process data; and
    a memory controller comprising the forward and reverse memory sparing logic circuitry.

7. The processor as in claim 1 wherein the forward memory sparing logic circuitry comprises at least one multiplexer to redirect portions of a cache line to locations in a spare memory device during a write operation and to place portions of the cache line in correct positions for reading by the processor during a read operation.

8. The processor as in claim 1 wherein the reverse memory sparing operation comprises temporarily copying data stored in one or more spare memory devices or portions thereof to one or more corresponding failed memory devices or portions thereof.

9. The processor as in claim 8 wherein the second memory sparing operation comprises copying the data stored in the one or more failed memory devices or portion thereof to the spare memory devices or portions thereof, and further copying data stored in one or more additional memory devices to new portions of the spare memory device and/or to a new spare memory device.

10. A method comprising:
    performing a first forward memory sparing operation at a first level of granularity in response to detecting a memory failure;
    performing a reverse memory sparing operation in response to a determination of an improved sparing state having a second level of granularity; and
    responsively performing a second forward memory sparing operation at the second level of granularity.

11. The method as in claim 10 wherein the improved sparing state is to be determined in response to one or more additional memory failures.

12. The method as in claim 10 wherein the first forward memory sparing operation is to cause a move from an N failure state to an N+1 failure state; the reverse memory sparing operation is to cause a move from the N+1 failure state back to the N failure state; and the second memory sparing operation is to cause to move from the N failure state to a new N+1 failure state.

13. The method as in claim 10 wherein the first level of granularity comprises a memory bank and the second level of granularity comprises a memory device.

14. The method as in claim 10 wherein each of the first level of granularity and the second level of granularity are selected from a group consisting of a bit, a device, a cache line, a row, a column, a bank, a rank, and a DIMM.

15. The method as in claim 10 wherein the forward memory operation is performed using at least one multiplexer to redirect portions of a cache line to locations in a spare memory device during a write operation and to place portions of the cache line in correct positions for reading by the processor during a read operation.

16. The method as in claim 10 wherein the reverse memory sparing operation comprises temporarily copying data stored in one or more spare memory devices or portions thereof to one or more corresponding failed memory devices or portions thereof.

17. The method as in claim 16 wherein the second memory sparing operation comprises copying the data stored in the one or more failed memory devices or portion thereof to the spare memory devices or portions thereof, and further copying data stored in one or more additional memory devices to new portions of the spare memory device and/or to a new spare memory device.

18. A system comprising:
a memory to store instructions and data, the memory including at least one spare memory device;
a plurality of cores to execute the instructions and process the data;
a graphics processor to perform graphics operations in response to certain instructions;
a network interface for receiving and transmitting data over a network;
an interface for receiving user input from a mouse or cursor control device; and
a processor comprising:
forward memory sparing logic to perform a first forward memory sparing operation at a first level of granularity using the spare memory device in response to detecting a memory failure;
reverse memory sparing logic to perform a reverse memory sparing operation in response to a determination of an improved sparing state having a second level of granularity; and
the forward memory sparing logic to responsively perform a second forward memory sparing operation at the second level of granularity.

19. The system as in claim 18 wherein the improved sparing state is to be determined in response to one or more additional memory failures.

20. The system as in claim 18 wherein the first forward memory sparing operation is to cause a move from an N failure state to an N+1 failure state; the reverse memory sparing operation is to cause a move from the N+1 failure state back to the N failure state; and the second memory sparing operation is to cause to move from the N failure state to a new N+1 failure state.

21. The system as in claim 19 wherein the first level of granularity comprises a memory bank and the second level of granularity comprises a memory device.

22. The system as in claim 18 wherein each of the first level of granularity and the second level of granularity are selected from a group consisting of a bit, a device, a cache line, a row, a column, a bank, a rank, and a DIMM.

23. The system as in claim 18 wherein the reverse memory sparing operation comprises temporarily copying data stored in one or more spare memory devices or portions thereof to one or more corresponding failed memory devices or portions thereof.

24. The system as in claim 23 wherein the second memory sparing operation comprises copying the data stored in the one or more failed memory devices or portion thereof to the spare memory devices or portions thereof, and further copying data stored in one or more additional memory devices to new portions of the spare memory device and/or to a new spare memory device.

* * * * *